United States Patent [19]

Zrnich

[11] Patent Number: 4,617,610
[45] Date of Patent: Oct. 14, 1986

[54] PRINTED WIRING BOARD RETAINER

[75] Inventor: Milan Zrnich, Bensenville, Ill.

[73] Assignee: GTE Communication Systems Corp., Northlake, Ill.

[21] Appl. No.: 797,099

[22] Filed: Nov. 12, 1985

[51] Int. Cl.$^4$ .............................................. H05K 7/14
[52] U.S. Cl. .................... 361/415; 339/17 M; 339/17 LM; 339/65; 339/22 B; 361/413
[58] Field of Search .................. 361/399, 412–413, 361/415, 429; 211/40, 41; 339/17 M, 17 LM, 65–66, 22 B

[56] References Cited

U.S. PATENT DOCUMENTS

| | | | |
|---|---|---|---|
| 2,832,013 | 4/1958 | Pedersen et al. | 361/399 |
| 4,051,549 | 9/1977 | Fiege | 361/399 |
| 4,429,937 | 2/1984 | Stockmaster | 361/415 X |

FOREIGN PATENT DOCUMENTS

WO84/04224  10/1984  PCT Int'l Appl. ................. 361/399

Primary Examiner—Arthur T. Grimley
Assistant Examiner—Jane K. Lau
Attorney, Agent, or Firm—Robert J. Black

[57] ABSTRACT

A retainer for printed wiring boards mounted in a file including an open front face through which the printed wiring boards are inserted. A plurality of clips are clipped to a front support bar supporting a lower edge of the printed wiring boards and extending between a front end of a pair of support arms. The clips are arranged for sliding nonrotational movement along the support bar and each includes a retainer slot in which a retainer bar is positioned to engage a front edge of each of the printed wiring boards thereby to prevent their removal. Each clip includes a cavity which may be slid into engagement with a foot portion of the retainer bar to lock the bar in position and prevent unintentional dislodging of the retainer bar.

14 Claims, 3 Drawing Figures

PRINTED WIRING BOARD RETAINER

BACKGROUND OF THE INVENTION

(1) Field of the Invention

The present invention relates to printed wiring board retainers and more particularly, to a printed wiring board retainer arranged in an unlocked position to prevent movement of printed wiring boards out of their associated slots within a file due to vibration encountered while the boards are in service and which may be locked in position to prevent dislodging of the board retainer on the printed wiring boards as during shipment of a file containing boards.

(2) Backoround Art

Printed wiring board retainers are very well known to those skilled in the art. In this regard, U.S. Pat. No. 3,283,213 to Kosanda teaches a printed wiring board guide employing a flexible lock member including a board passing groove and a board engaging catch slideably engaged with a lateral track formed at a front end of the board guide. The latch is displaced laterally permitting the printed wiring board to be inserted through the board passing slot and into the board guide where upon the latch is released to engage a front edge of the printed wiring board via the board engaging catch thereby locking the printed wiring board within the board guide.

U.S. Pat. No. 3,691,430 to Freitag teaches a circuit board assembly employing latch members adapted to be pivotly affixed to circuit board support bars positioned between adjacent sets of guide rails, the latch members may be pivoted about the support bars to an open position thereby allowing the circuit boards to be individually inserted into channels and then pivoted to a closed position whereat overlying portions of catch members obstruct the channels in which the printed wiring boards are inserted to prevent unintentional removal of the boards.

Finally, U.S. Pat. No. 4,051,549 to Fiege teaches a hinged retaining bar which engages otherwise free edges of circuit cards when in position in a card file. The hinged retaining bar has a engagement face of resilient material providing elastic engagement with a front edge of each card to provide a unique gripping action of the card front edge.

The above arrangements while operating generally satisfactorily involve the design and fabrication of costly and complicated component parts.

SUMMARY OF THE INVENTION

The present invention provides an uncomplicated retainer for printed wiring boards mounted in a file including an open front face through which the boards are inserted. The file includes at least a first and a second support arm, a front support bar connected between a front end of each of the support arms and engaging a lower edge of the printed wiring boards to support them. The retainer includes a plurality of clips clipped to the support bar at predetermined positions therealong. The clips may be of rectangular c-shaped construction and engage a rectangular support bar to prevent rotational movement of the clips about the bar. Additionally, the clips each include an upper arm extending forward of the support bar and also forward of a front edge of the printed wiring boards. A retainer slot is formed in an upper surface of each of the upper arms and a retainer bar is positioned within the retainer slots whereat it engages a front edge of the printed wiring boards to thereby prevent movement of the boards out of the file.

The retainer bar may be of L-shaped cross-section including notches cut in a foot portion which engage cavities in a side of the clips to lock the retainer bar in engagement with the clips thereby to prevent accidental dislodgement of a back portion of the retainer bar from the retainer slots formed in the clip upper arms as may happen during equipment shipment.

DESCRIPTION OF THE DRAWING

An understanding of the present invention will be apparent from the following description taken in conjunction with the accompanying drawing in which.

DESCRIPTION OF THE PREFERRED EMBODIMENT

Figure 1:
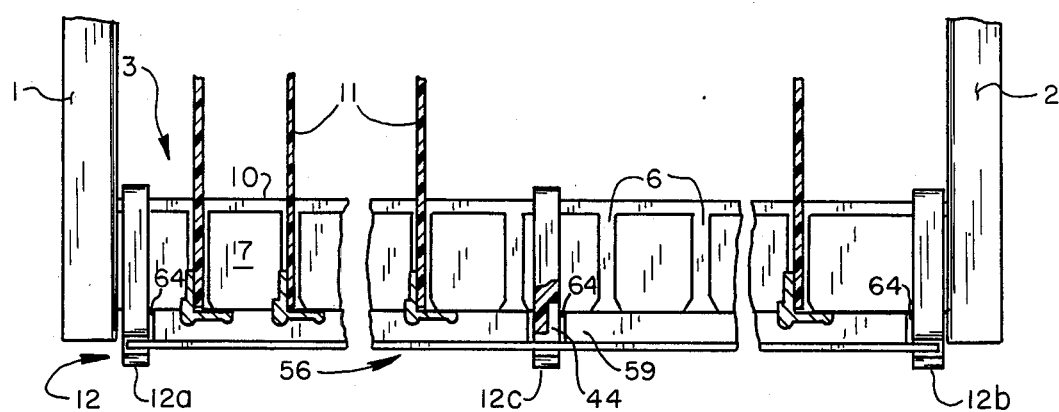
FIG. 1 is a top view of a printed wiring board file employing the board retainer of the present invention.
Figure 2:
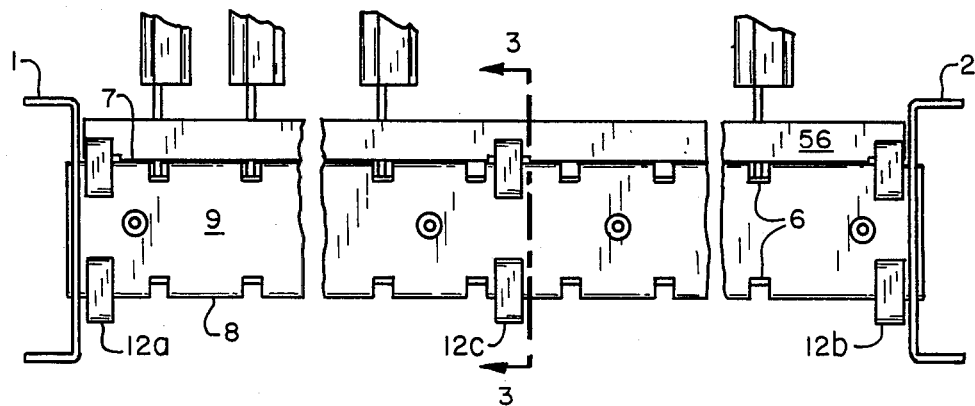
FIG. 2 is a front elevational view of a printed wiring board file employing the board retainer of the present invention.
Figure 3:
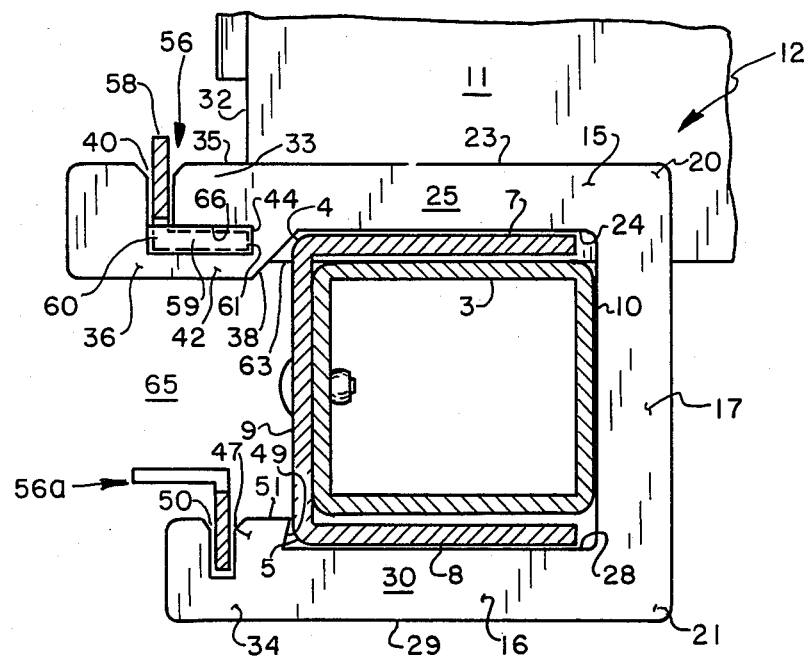
FIG. 3 is a cross-sectional view of the printed wiring board file taken along the line 3—3 in FIG. 2 and showing a side view of the board retainer of the present invention.

Referring now to FIGS. 1 and 2, there is shown a printed wiring board retainer in accordance with the present invention including a left or first printed wiring board file support arm 1 and a right or second printed wiring board file support arm 2, both arms connected at a front end by a front support bar 3 extending therebetween. Referring to FIG. 3, the front support bar 3 may be of formed metal construction with the front surface 9 of the support bar 3 meeting with the upper surface 7 at an upper front rounded corner 4 and meeting the lower surface 8 at a lower front rounded corner 5. Referring again to FIGS. 1 and 2, the front support bar 3 may be of rectangular cross-section (shown in FIG. 3) and may include a plurality of printed wiring board guides 6 formed in an upper surface 7 and a lower surface 8 thereof. A plurality of printed wiring boards 10 may be positioned within the card slots 6.

A plurality of printed wiring board retaining clips 12 of rectangular C-shape and of resilient construction are positioned at predetermined positions along the front support bar. In this regard, a first retaining clip 12a may be positioned on the front support bar 3 adjacent the left support arm 1, a second retaining clip 12b may be positioned on the front support bar 3 adjacent the right support arm 2, and finally, a third retaining clip 12c may be positioned at a point intermediate the first retaining clip 12a and the second retaining clip 12b on the front support bar 3. It will be understood that while three retaining clips have been described, other numbers of clips may be positioned at predetermined positions on the support bar without departing from the spirit of the present invention.

Referring now to FIG. 3, the retaining clip 12 includes an upper arm 15, a lower arm 16 and an arm brace 17 connected between a rear end 20 of the upper clip arm 15 and a rear end 21 of the lower clip arm 16. The upper clip arm 15 includes an upper surface 23, a lower surface 24 and a side surface 25. Similarly, the lower clip arm 16 includes an upper surface 28, a lower surface 29 and a side surface 30. The side surfaces 25 and 30 of the upper clip arm 15 and the lower clip arm 16 respectively lie in a common plane.

The upper clip arm 15 includes an upper extension 33 generally coaxial with the upper clip arm 15 and projecting beyond the front surface 9 of the support bar 3 and also beyond a front edge 32 of the printed wiring boards 11 a predetermined distance. Similarly, the lower clip arm 16 includes a lower extension 34 generally coaxial with the lower clip arm 16 and projecting beyond the front surface 9 of the support bar 3. The upper extension 33 of the upper clip arm 15 includes an upper surface 35 coplanar with the upper surface 23 of the upper clip arm 15 and a step 36 extending downward a predetermined distance below the lower surface 24 of the upper clip arm 15. The step 36 includes a face 38 facing toward the arm brace 17 and forming an obtuse angle with the lower surface 24 of the upper clip arm 15. A retainer slot 40 is formed in the upper surface 35 of the extension 33. The upper extension 33 includes a side surface 42 coplanar with the side surface 25 of the upper clip arm 15. A cavity 44 in the form of a channel extends in the side 35 of the upper clip arm extension 33 from the retainer slot 40 in a horizontal direction towards the support bar 3 a predetermined distance.

The extension 34 of the lower clip arm 16 includes a step 47 extending in an upward direction a predetermined distance above the upper surface 28 of the lower clip arm 16. The step 47 includes a face 49 facing the arm brace 17 and forming an acute angle with the upper surface 28 of the lower clip arm 16. A storage slot 50 is formed in an upper surface 51 of the step 47.

The printed wiring board retainer of the present invention further includes a retainer bar 56 of L-shaped cross-section including a vertically oriented back portion 58 and a foot portion 59. The back portion 58 is connected to the foot portion 59 via a formed corner or heel 60. The foot portion 59 includes a toe end 61 positioned above a lower edge 63 of the printed wiring board 11 and adjacent to the front edge 32 of the printed wiring boards 11. The foot portion 59 is removed at predetermined positions along the retainer bar 3 forming a plurality of notches 64 (see FIG. 1) each adapted to accept one of the clip extensions 33. Finally, the foot portion 59 has a length between its heel 60 and its toe end 61 greater than a width dimension of the storage slot 50.

In operation, the printed wiring board retainer of the present invention may be assembled to the front support bar of the printed wiring board file by applying the clips 12 to the front support bar 3. In this regard, a first clip 12a may be positioned with its upper clip arm extension 33 and lower clip arm extension 34 adjacent the rear surface 10 of the front support bar 3 and force applied to the extensions 33 and 34 in a direction to displace the extensions apart thereby opening a throat area 65 between the extensions 33 and 34 sufficiently to permit passage of the support bar 3 therethrough. The clip 12a is then slipped over the front support bar 3 to a point where the clip arm brace 17 engages and contacts the rear surface 10 of the support bar 3. Following positioning of the clip 12a forced is removed from the extensions 33 and 34 thereby permitting the lower surface 24 of the upper clip arm 15 to engage the upper surface 7 of the support bar 3 and the upper surface 28 of the lower clip arm 16 to engage the lower surface 8 of the support bar 3. In such position the face 49 of the step 47 by virtue of its acute angle relation to the upper surface 28 of the lower arm 16, will engage the front surface 9 of the support bar 3 at a point above the rounded corner 5. Such engagement is provided to prevent the face 49 from contacting the rounded corner 5 and thus assists in preventing rotation of the retainer clip 12a in a counter clockwise direction (shown in FIG. 3).

In similar manner a second retainer clip 12b may be positioned adjacent to the right support arm 2 and a third retainer clip 12c may be positioned at a point on the support bar 3 intermediate the first retainer clip 12a and a second retainer clip 12b.

Following installation of the retainer clips 12, the retainer bar 56 is positioned in front of the printed wiring boards 11 with the back portion 58 in alignment with the retainer slot 40 of the extension 33 and the back portion slid into the retainer slot 40 in each of the clips 12. In such position, movement of the printed wiring boards 11 out of their card slots 6 will be resisted by the toe edge 61 of the foot portion 59 acting against the front edge 64 of the printed wiring board 11.

In the event that it becomes necessary to remove a printed wiring board, the retainer bar 56 may be vertically lifted from engagement of its back portion 58 with the retainer slot 40 thereby freeing the printed wiring boards 11 for removal. A storage slot 50 has been provided in the lower arm extension 34 of the lower clip arm 16 to ensure that the retainer bar 56 is not misplaced while removed. Placement of the retainer bar 56 in the storage slot 50 is accomplished by rotating the bar to an inverted position and positioning the back portion 58 of the retainer bar 56 within the storage slot 50 (shown as element 56a as in FIG. 3).

In the event that one or more of the retainer clips 12 becomes broken or it becomes necessary to remove the clips from the support bar 3, such may be accomplished by applying force to the extension 34 of the lower clip arms 16 in a downward direction to disengage the face 49 from the front surface 9 of the support bar 3. Force may then be applied to the extension 33 of the upper clip arm 15 in a direction toward the rear end 20. Such force will permit the face 38 the extension 33 to engage the rounded corner 4 of the support bar 3 and slide along the rounder corner 4 to the point where the step 42 of the extension 33 passes over the upper surface 7. As the extension 33 passes over the upper surface 7 of the support bar 3, the upper surface 51 of the extension 34 will pass beneath the lower surface 8 thereby permitting the clip to disengage the support bar 3. Following disengagement of the clip from the support bar 3 force is removed from the extension 34 thereby completing removal of the clip 12 from the support bar 3.

In the event it is desirable or necessary to lock the retainer bar 56 in the printed wiring board retaining position, such may be accomplished by repositioning at least one of the clips to engage and lock the retainer bar 56 in position. In this regard and referring to FIG. 1, the retainer clip 12c may be slid in a direction toward the right support arm 2 to a point where the cavity 44 engages the foot portion 59 of the retainer bar 56. In such a position movement of the retainer bar 56 in a vertical direction to disengage the back portion 58 of the retainer bar 56 from the retainer slots 40 is prevented by the foot portion 59 in engagement with the cavity 44.

It is also anticipated that a cavity 44a (not shown) similar to the cavity 44 may be formed in a side 33a (not shown) of the clips 12 opposite the side 33 of the upper clip arm extension 33 to thereby permit engagement of the foot portion 59 with the cavities 44 or 44a by sliding the clips 12 in either of two opposite directions along the support bar 3.

Although the preferred embodiment of the present invention has been illustrated, and the form described in detail, it will be readily apparent to those skilled in the art that various modifications may be made therein without departing from the spirit of the invention or from the scope of the appended claims.

What is claimed is:

1. A retainer in combination with a plurality of printed wiring boards mounted a file including an open front face through which a plurality of printed wiring boards are inserted, said file including at least a first and a second support arm, a front support bar connected between a front end of each of said support arms and engaging a lower edge of each of said printed wiring boards to support said boards, said retainer comprising: a plurality of clips clipped to said support bar at predetermined positions therealong;
an upper arm included in each of said clips, said arm including an extension extending forward of a front edge of each of said printed wiring boards;
a retainer slot formed in each of said upper arms; and
a retainer bar of rigid construction positioned within said retainer slots, said bar positioned above said printed wiring board lower edges and adjacent said printed wiring board front edges, whereby to prevent movement of said printed wiring boards out of said file.

2. A retainer as claimed in claim 1, wherein: said clips are each of rectangular c-shaped cross-section including an upper arm positioned adjacent to an upper surface of said support bar, a lower arm positioned adjacent to a lower surfaces of said support bar and an arm brace joining a rear end of said upper and lower arms and positioned adjacent to a rear surface of said support bar.

3. A retainer as claimed in claim 2, wherein: said upper arms each include a extension projecting beyond a front surface of said support bar and said retainer slot is formed in an upper surface of each of said upper arm extensions.

4. A retainer as claimed in claim 3, wherein: said lower arms each include a extension projecting beyond a front surface of said support bar and said lower arm extension includes a storage slot formed in an upper surface thereof, and storage slot adapted to receive and store said retainer bar in the event that said retainer bar is removed from said retainer slot.

5. A retainer as claimed in claim 4, wherein: said upper and lower extensions of each of said clips includes a step, said extension steps of each clip facing each other and defining a narrowed clip mouth, said upper and lower arms operated to deflect apart thus to open said clip mouth and permit passage therethrough of said support bar, said arms further operated following passage of said support bar to restore and close said mouth and secure said clip to said support bar.

6. A retainer as claimed in claim 5, wherein: said lower extension step includes a locking face adapted to engage said support bar front surface, said locking face engaging said front face of said support bar to prevent movement of said lower arm in a rearward direction and thus assist in preventing rotational movement of said clip about said support bar.

7. A retainer as claimed in claim 6, wherein: said front and lower surfaces of said support bar meet at a rounded corner and said locking face forms an acute angle with said lower arm upper surface, said locking face engaging said support bar front surface at a point above said rounded corner thus to assist in preventing rotation of said clip about said support bar.

8. A retainer as claimed in claim 5, wherein: each of said upper extension steps includes a face forming an obtuse angle with said upper arm lower surface, and said front and upper surfaces of said support bar meet at a rounded corner, said upper extension step face engaging said rounded corner in response to the application of force to said clip in a rearward direction and disengagement of said lower bar step from said support bar to disengage said clip from said support bar.

9. A retainer as claimed in claim 4, wherein: said retainer bar is of L-shaped cross-section including a back portion of predetermined thickness and a foot portion of predetermined width, said storage slot of width greater than said back portion thickness and less than said foot portion width, said slot formed in said lower arm extension at a position closer to said support bar front surface than said foot width, said retainer bar inverted and said back portion inserted in said storage slot and stored.

10. A retainer as claimed in claim 1, wherein: said retainer bar of L-shaped oross-section includes a vertically oriented back portion positioned within said clip retainer slot.

11. A retainer as claimed in claim 10, wherein: said retainer bar includes a foot portion attached to said back portion at a heel edge and further includes a toe edge positioned to engage said printed wiring board front edges.

12. A retainer as claimed in claim 11, wherein: said retainer slots are each formed of width sufficient to accept said retainer bar back portion and said retainer bar foot portion is removed at predetermined positions forming a notch at places where said clip retainer slots engage said support bar.

13. A retainer as claimed in claim 12, wherein: said foot notch is of greater width than said clip.

14. A retainer as claimed in claim 12, wherein: said clips each are slideably secure to said support bar and each includes at least one cavity formed in at least one side thereof, said cavity adapted to receive said retainer bar foot portion and said clip slid along said support bar in a direction to engage said foot portion with said cavity thus to prevent said removal of said retainer bar from said clips.

* * * * *